United States Patent [19]
Wright et al.

[11] Patent Number: 5,648,992
[45] Date of Patent: Jul. 15, 1997

[54] MULTIPLE ANTENNA HOME BASE FOR DIGITAL CORDLESS TELEPHONES

[75] Inventors: David Wright, Utica, N.Y.; James E. Petranovich, Encinitas, Calif.; Rex L. Baker, San Diego, Calif.; Neal K. Riedel, Encinitas, Calif.

[73] Assignee: Rockwell Semiconductor Systems, Inc., Newport Beach, Calif.

[21] Appl. No.: 699,217

[22] Filed: Aug. 19, 1996

Related U.S. Application Data

[63] Continuation of Ser. No. 129,562, Sep. 30, 1993, abandoned.
[51] Int. Cl.[6] .......................... H04B 7/08; H04B 17/02
[52] U.S. Cl. .................... 375/347; 455/134; 455/277.2
[58] Field of Search ............................ 375/225, 267, 375/345, 347, 350; 455/134–136, 140, 270, 277.2, 33.3; 379/58–63

[56] References Cited

U.S. PATENT DOCUMENTS

| | | | |
|---|---|---|---|
| 4,584,713 | 4/1986 | Bruckert et al. | 455/277.2 |
| 4,742,568 | 5/1988 | Furuya | 455/277.2 |
| 4,823,398 | 4/1989 | Hashimoto | 455/134 |
| 4,977,615 | 12/1990 | Suzuki et al. | 455/277.2 |
| 5,097,484 | 3/1992 | Akaiwa | 375/367 |
| 5,119,501 | 6/1992 | Perry et al. | 455/33.3 |
| 5,161,252 | 11/1992 | Higuchi et al. | 455/78 |
| 5,184,349 | 2/1993 | Riordan | 370/95.3 |
| 5,187,809 | 2/1993 | Rich et al. | 455/33.1 |
| 5,203,018 | 4/1993 | Hirose | 455/61 |
| 5,203,024 | 4/1993 | Yamao | 455/133 |
| 5,239,541 | 8/1993 | Murai | 375/347 X |
| 5,267,272 | 11/1993 | Cai et al. | 375/345 |
| 5,303,396 | 4/1994 | Ooyagi et al. | 455/134 |
| 5,325,403 | 6/1994 | Siwiak et al. | 375/347 |
| 5,369,801 | 11/1994 | Smith | 455/277.1 |
| 5,430,769 | 7/1995 | Patsiokas et al. | 375/347 |
| 5,440,590 | 8/1995 | Birchler et al. | 375/347 |
| 5,530,926 | 6/1996 | Rozanski | 455/277.2 |

*Primary Examiner*—Young T. Tse
*Attorney, Agent, or Firm*—William C. Cray; Susie H. Oh

[57] ABSTRACT

The present invention provides methods for combining antenna diversity and gain control in a communications system using a single chain of receiver electronics. A number of input parameters related to various characteristics of a received signal are used to determine the quality of the received signal. The antenna diversity and gain control procedures are enabled or disabled based on the signal quality. The antenna diversity procedure estimates the signal level of the non-operational antenna using an infinite impulse response digital filter. The gain control procedure selects one of three gain paths based on the received signal strength.

20 Claims, 9 Drawing Sheets

MULTIPLE ANTENNA HOME BASE FOR DIGITAL CORDLESS TELEPHONES

This is a continuation, of application Ser. No. 08/129,562, filed Sep. 30, 1993, now abandoned.

FIELD OF THE INVENTION

The present invention is directed to methods of combining antenna diversity and gain control in a communications system. More particularly, the invention is directed to methods of antenna diversity and gain control in a communications system using Time Division Duplexing and having multiple antennas with single receive channel electronics.

BACKGROUND

An advanced digital cordless telephone (DCT) system uses digital, time divided, transmissions referred to as TDD (time division duplexing). The transmissions occur between one or more portable hand held units (typically pedestrians or persons moving around in an office building) and a base station which serves a defined geographic area known as a cell. A typical operational frequency for a DCT is in the vicinity of 2000 MHz. The base station typically transmits a burst of data every 5 milliseconds and the portable handheld unit transmits back a burst of data about 2.5 milliseconds after the base station transmits. Both units transmit at the same frequency, and transmit bursts are typically about 625 microseconds (including guard time) as shown in FIG. 1. Based on these timing constraints the DCT system can provide four channels so that four communications links can be established between four portable units and the base station. Each of the portable units is assigned one of the 625 μsec. slots in each of the 2.5 msec. receive and transmit windows.

In an urban or indoor environment there is significant multipath effect with transmissions at this frequency range, which manifests itself as Rayleigh fading of the received signal level. One technique used to minimize this problem is known as diversity. The underlying idea behind diversity, as an antidote to Rayleigh fading, is that if one is able to obtain reception via two (or more) independent paths then it is unlikely that both (or all) of these paths will fade simultaneously. These independent paths may be obtained by diversity in time, frequency, or space. Since the DCT operates in TDD, time diversity is not a good solution to correct the multipath problem since implementing time diversity in the DCT would require at least twice as much time to be allotted to each channel. Similarly, frequency diversity is problematic for a TDD system in that both base stations and portable handheld units are designed to operate at only one frequency.

Therefore, to combat this fading, the base station might include two or more antennas. Each antenna receives a different standing wave pattern. The base station attempts to select the antenna with the stronger signal path. This technique is referred to as space diversity. Some typical signal levels versus location plots are shown in FIG. 2. As long as the portable unit moves a small percentage of the fading distance in a frame time (equivalent to a burst), the ideal signal path will be the same for both base station and the portable unit within one frame or burst time.

It is possible to build two entire receive chains (i.e., hardware and software required to detect, demodulate and decode the received signal) in the base station radio, and after each burst is received use data from the burst with the higher signal strength or the lowest error rate. This technique, often called selection diversity, works very well. Although, selection diversity may be very effective in combatting the effects of fading, it has several drawbacks.

First, providing a separate receive chain for each of the antennas drives up the cost and complexity of the system. If it is desirable to provide a low cost processor to provide the switching control, a separate receive chain for each antenna may be prohibitive. Furthermore, the added complexity in evaluating the signal as received and demodulated by each receive chain adds to the cost of the processor and requires more complicated programming.

Alternatively, multiple antennas may be used with a single receive chain. However, these diversity systems although less expensive and less complex to implement, create other design problems. For instance, almost all radio receivers implement some form of gain control to prevent saturation and degradation due to intermodulation when the received signal level is too high or to increase the signal-to-noise ratio of the received signal when the received signal level is too low. Since the signal level received by each antenna may vary, the gain required for each antenna may also vary. In the past, determining the proper gain adjustment for a selected antenna could only begin after the antenna was actually switched to an ON state. Therefore, it has been virtually impossible to effectively combine antenna switching and gain control in a single receive chain implementation.

Furthermore, previous antenna diversity systems having a single receive chain have used an averaging technique to estimate the signal levels at the OFF antennas. Such averaging techniques require that estimates for a number of previous frames be stored in memory. For instance if N is the number of frames to average over, the estimated average signal level y{n} would be:

$$y\{n\}=y\{n-1\}+1/N*x\{n\}+1/N*x\{n-N\}$$

where x{n} is the measured signal level of the received signal. It is evident from the above equation that N measured signal levels must be stored to carry out the averaging. As N increases, so does the memory requirements and the implementation costs.

Another disadvantage of switch diversity using a single receive chain is that when a signal on one antenna is weak but usable, the signal on the other antenna may be weaker. In that event it would be undesirable to switch to the other antenna merely to determine that the received signal from that antenna is not only just as weak but unusable. Some previous diversity systems have provided some control to enable or disable switching if the received signal is determined to be acceptable. However, such systems have merely considered the signal level of the received signal in determining whether the received signal using the currently selected antenna is acceptable. Typically, other characteristics of the received signal should be considered to avoid unnecessary and ineffective switching.

Therefore, there is a need for a method providing antenna diversity and gain control in a single chain implementation which is both low in cost and simple to implement without substantially reducing the performance of the communications.

SUMMARY OF THE INVENTION

The present invention fulfills this need by providing simple, low cost, methods for combining both antenna diversity and gain control in a single chain implementation. In particular one method according to the present invention uses a variety of input parameters which characterize the quality of the received signal to generate a signal quality indicator. The signal quality indicator is used to enable or disable an antenna diversity procedure and a gain control procedure. In a preferred embodiment the input parameters include an estimated frequency variance of the received signal, an estimated timing variance of the received signal, an estimated average signal strength of the received signal, and an estimated frame error rate of the received signal. In a more preferred embodiment, the frequency variance, timing variance, average signal strength and frame error rate are estimated using an infinite impulse response (IIR) digital filter thereby eliminating the need to store many previous estimates in memory.

The present invention also provides a method of selecting one of two antennas in a single chain diversity system. According to this method of the present invention, a first antenna is selected to receive a transmitted signal. The selected antenna then receives the transmitted signal. A received signal strength indicator (RSSI) is input to the antenna diversity procedure and an average signal level for a number of bursts is estimated based in part on the RSSI. The signal level at the second antenna is then estimated based on the estimated average signal level and a previous estimated signal level at the second antenna. The RSSI and the estimated signal level at the second antenna are compared to provide an antenna diversity indicator which indicates which of the two antennas should be selected on the next burst. One of the two antenna is then selected based on the antenna diversity indicator. In a preferred embodiment the estimated average signal level and the estimated signal level at the second antenna are generated using appropriate IIR filters.

The present invention also provides a method of controlling the gain in a single chain diversity communications system. According to a preferred embodiment, one of three gain paths is provided by the communications system. The first gain path has the highest gain, the second gain path provides a medium gain, and the third gain path provides the lowest gain. One of the gain paths is selected. The transmitted signal is received and amplified by the gain corresponding to the selected gain path. The amplified signal level is measured to provide a current signal level. A low gain accumulator and a high gain accumulator are updated based on the current signal level.

A gain path with a lower gain is selected if one exists and if the low gain accumulator exceeds a predetermined switching threshold. A gain path with a higher gain is selected, if one exists and if the high gain accumulator exceeds the predetermined switching threshold. In a preferred embodiment, a high threshold and a low threshold are defined. The step of updating the gain accumulators is preferably carried out differently depending upon whether the current signal level falls above the high threshold, below the low threshold, or in between the two thresholds. Updating the gain accumulators is preferably carried out using an IIR filter.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION

Figure 3:
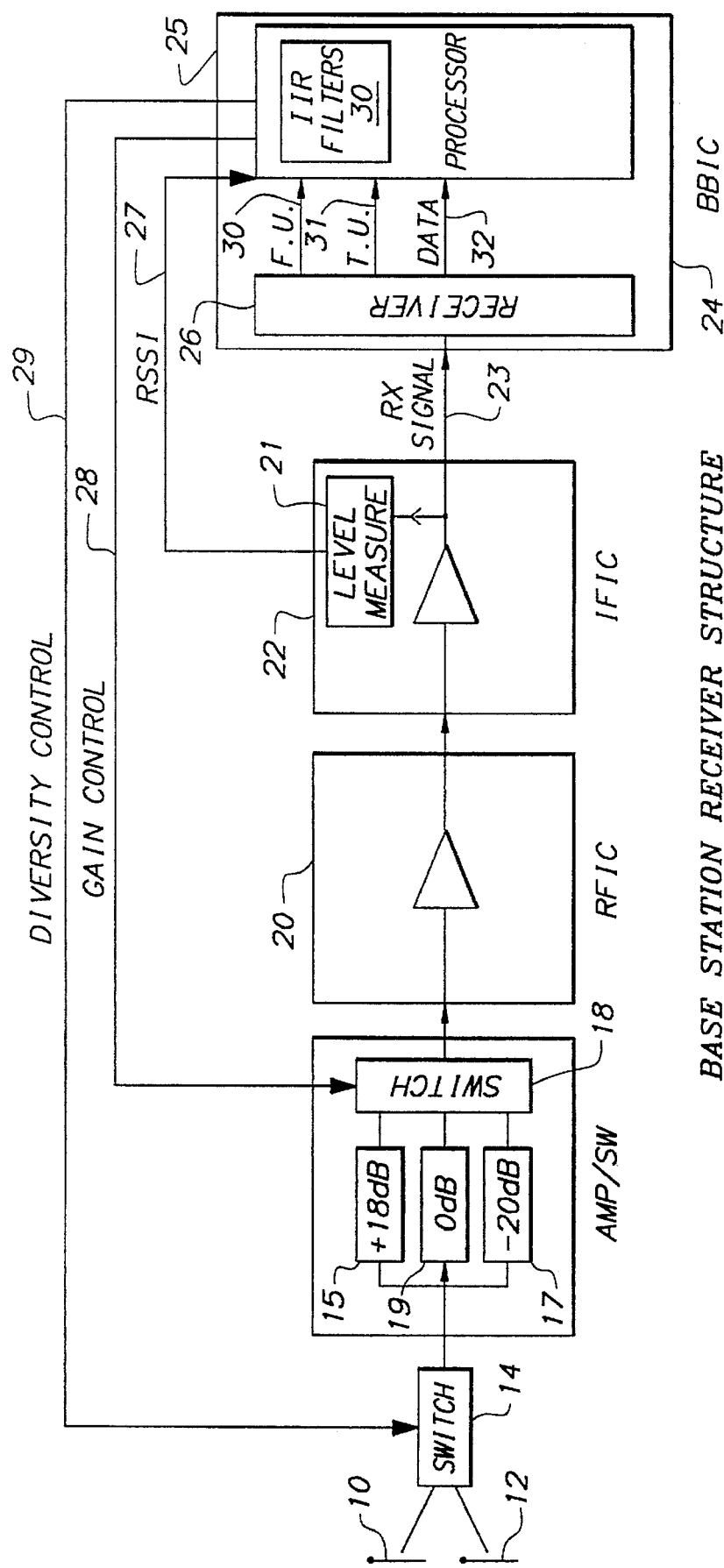
FIG. 3 is a block diagram of the base station receiver architecture.

The base station receiver structure is shown in FIG. 3. A first antenna 10 and a second antenna 12 are shown coupled to switch 14. Switch 14 couples either the first antenna 10 or the second antenna 12 to the receiver electronics depending upon the diversity control indicator 29 which is an input to switch 14. A signal transmitted from a portable handset is received by the selected antenna and passed to the gain control switch 18 by switch 14. Depending upon the gain control indicator 28, the gain control switch 18 selects one of three gain paths 15, 19 or 17. In particular switch 18 is configured to receive the gain control indicator 28 and select either the gain path 15, the no gain path 19, or the attenuation path 17. In a preferred embodiment, the gain path 15 is implemented using an 18 dB low noise amplifier and the attenuation path 17 is implemented using a 20 dB attenuator.

The received signal output from the gain control switch 18 is then input to a radio frequency integrated circuit (RFIC) 20 wherein the received signal is downconverted, filtered and amplified as is typical in a RF receiver. Similarly, the received signal is further downconverted, filtered and amplified in the intermediate frequency integrated circuit (IFIC) 22. The IFIC 22 also provides a power measurement device 21 which detects the power level of the received signal in the IFIC 22 to provide a Receive Signal Strength Indicator (RSSI) 27. If a gain adjustment has been made by the gain control switch 18, the value of the RSSI will reflect that adjustment such that the output 27 is RSSI plus a gain value. The received signal output from the IFIC 22 is shown as interface 23 and is provided as an input to the receiver 26. In a preferred embodiment the receiver 26 will provide a demodulator such as the one described in co-pending application Ser. No. 07/999,210 now U.S. Pat. No. 5,376,894. The receiver 26 demodulates the received signal to regenerate the transmitted data and output the data 32 to processor 25. During the demodulation process, receiver 26 determines the frequency variance (Fvar) of the received signal and outputs Fvar over interface 30 to the processor 25. Similarly, a timing variance (Tvar) related to symbol jitter is determined by receiver 26 during the demodulation process. Receiver 26 outputs Tvar to the processor 25 over interface 31.

The processor 25 implements a gain control procedure which uses the data, Fvar, Tvar, and the RSSI to determine which of the three gain paths 15, 19, or 17 should be selected on the next burst by switch 18. The output of the gain control procedure is the gain control indicator 28 shown in FIG. 3. Similarly, processor 25 implements an antenna diversity procedure which utilizes the data, Fvar, Tvar, and RSSI inputs to generate the diversity control indicator 29. As described in detail below, the processor 25 utilizes a number of IIR filters 30 in executing these various procedures.

Figure 4:
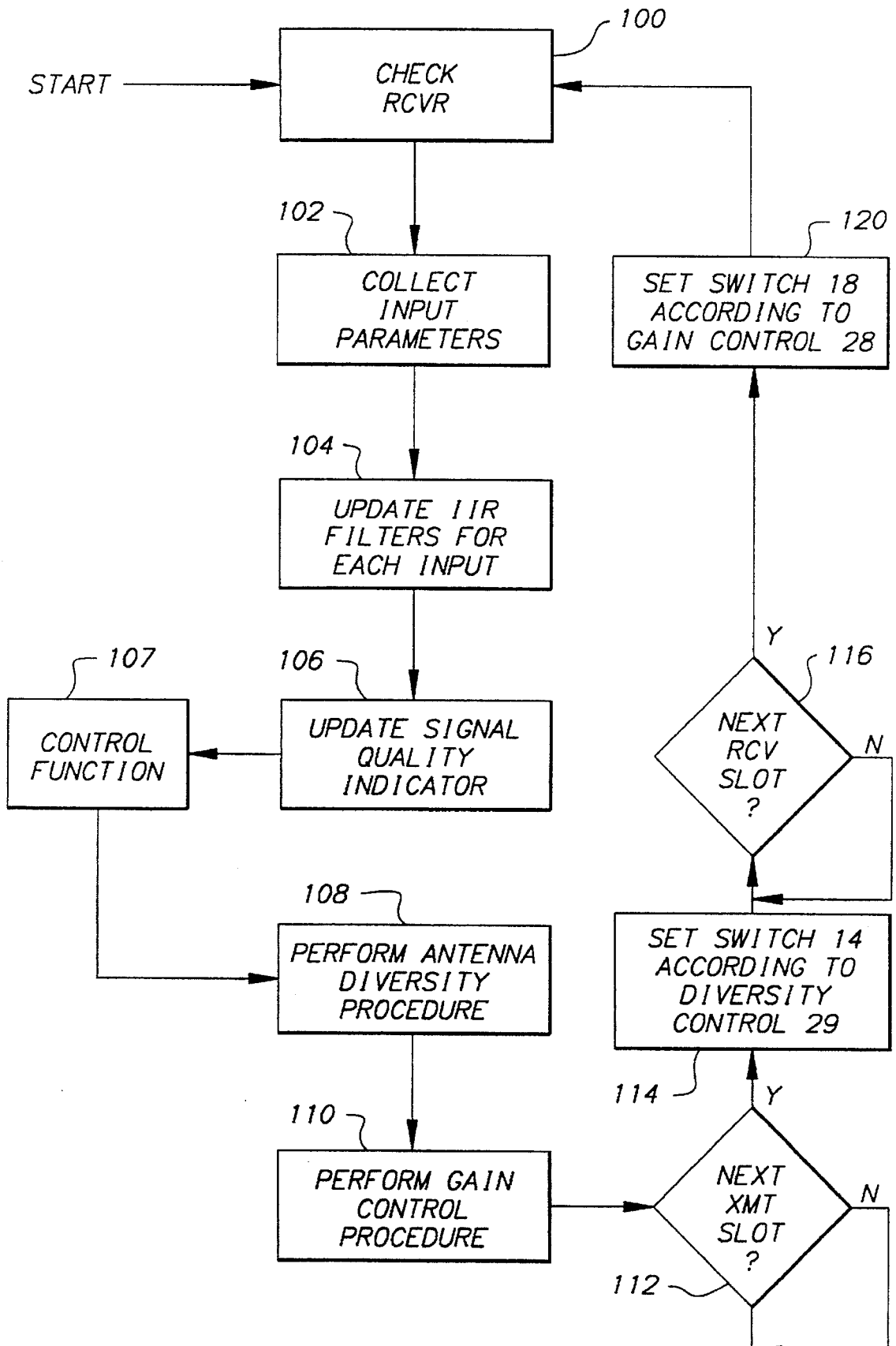
FIG. 4 is a flow diagram of the combined antenna diversity procedure and gain control procedure as carried out by the processor of the present invention.

A flow diagram of the overall antenna diversity and gain control procedures carried out by processor 25 is shown in FIG. 4. The processor checks the data interface with the receiver for an input of data following each burst as shown at 100. All of the inputs utilized by the procedures are obtained at 102 either directly from the other inputs to the processor, i.e., the RSSI, the Fvar, and Tvar inputs, or generated by the processor's software from one or more of these inputs. The inputs are filtered through an IIR filter at 104 to generate a substantially average value for each of the input parameters. A signal quality indicator (SQI) is updated at 106. The signal quality indicator is based upon the value of each of the filtered inputs and a desired Bit Error Rate (BER). A control program enables or disables the gain control procedure and the antenna diversity procedure at 107 depending upon the SQI. The antenna diversity procedure and the gain control procedure are executed at 108 and 110, respectively. Both procedures are executed even if they have been disabled. Details of each of the steps 102 through 110 are provided below.

The output of the antenna diversity procedure is the diversity control indicator discussed in connection with FIG. 3. If the antenna diversity procedure is disabled, the diversity control indicator will remain the same for each burst that it is disabled. The processor, then waits for the beginning of the next transmit slot at 112 and then outputs the diversity control indicator causing switch 14 in FIG. 3 to switch between the first and second antennas under the control of the diversity control indicator as shown at 114. Then when the base station transmits back to the portable handset it will transmit on the best of the two antennas in terms of signal quality and performance. Moreover, if the antenna diversity procedure is disabled then switch 14 will not switch between the first and second antennas because consecutive diversity control indicators will be the same while the antenna diversity procedure is disabled. Similarly, the gain control indicator is used to select one of the three gain paths as shown at 120 just before the next receive slot as shown at 116. The process then begins over again by checking the interface with the receiver for a data input.

Figure 1:
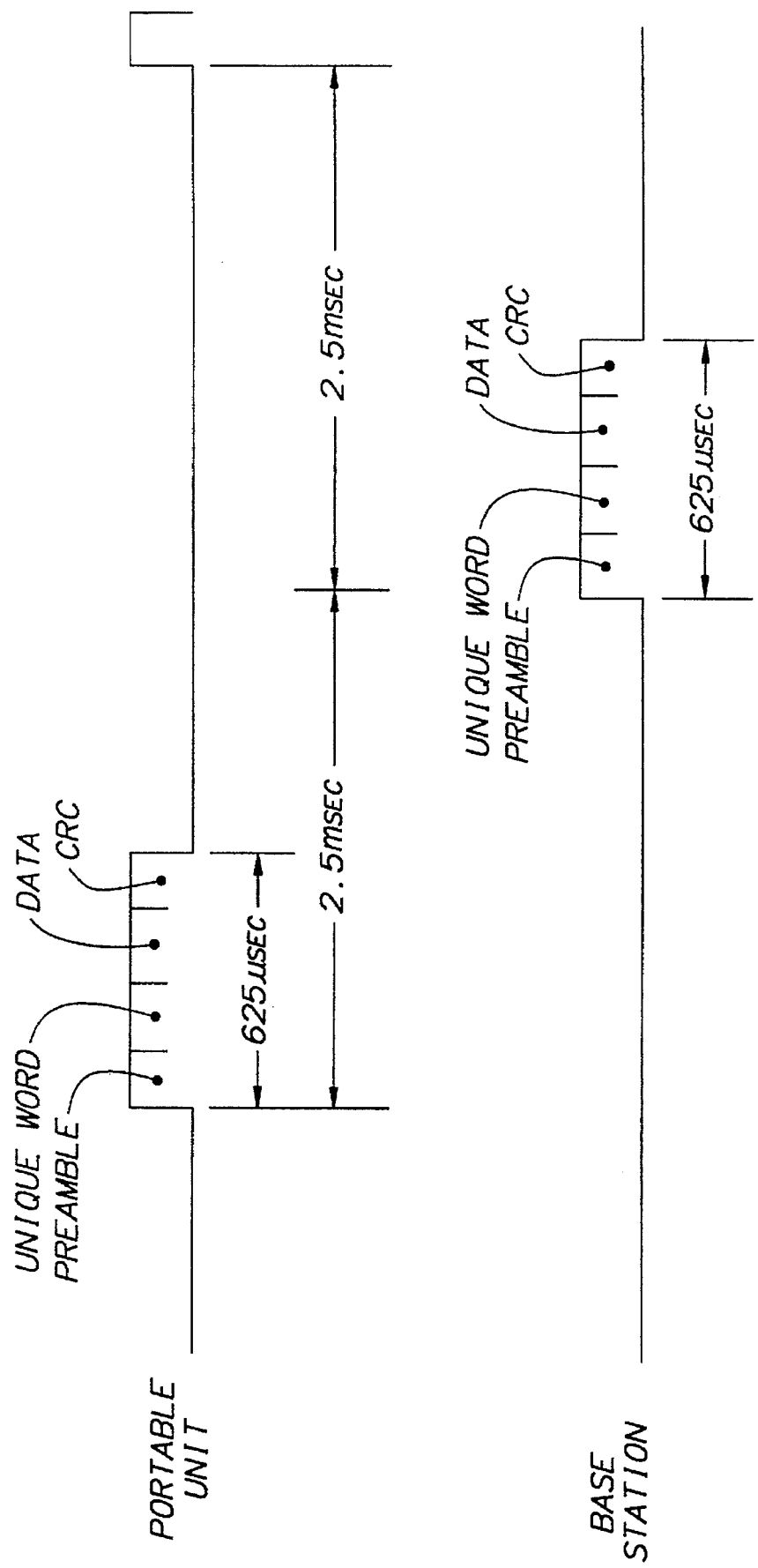
FIG. 1 is a timing diagram of a DCT system using TDD.
Figure 2:
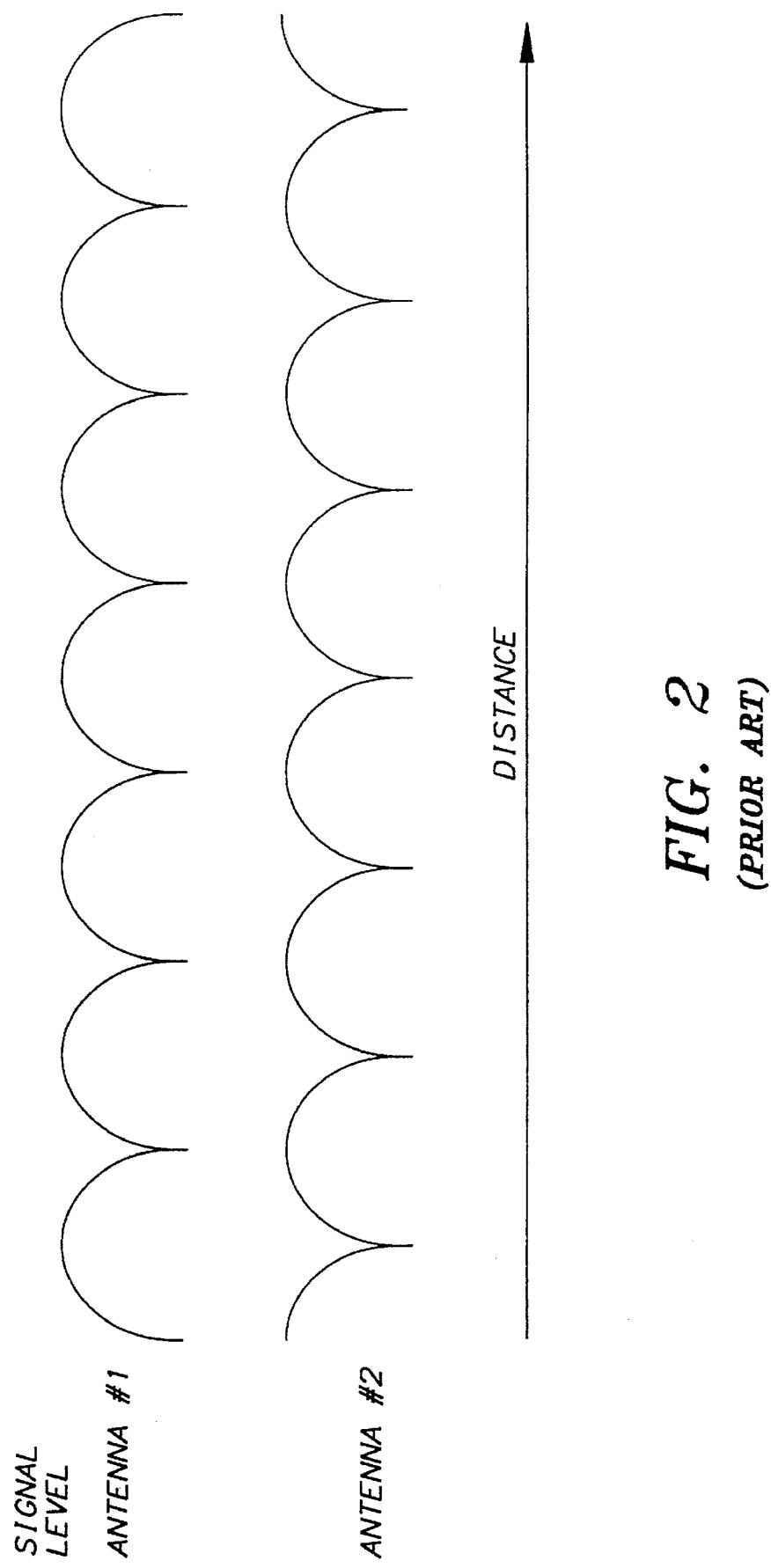
FIG. 2 shows signal fading as a function of distance.
Figure 5:
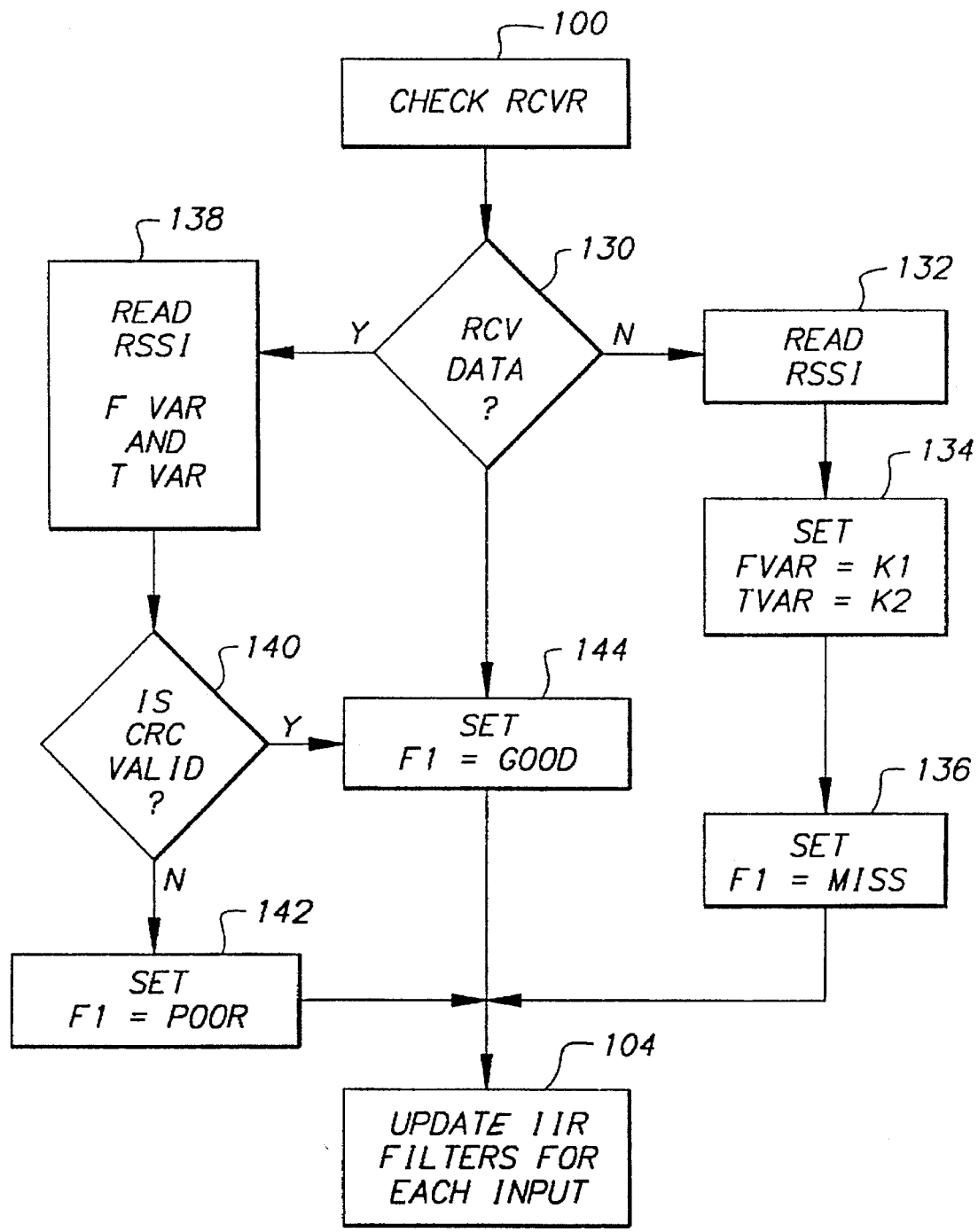
FIG. 5 is a detailed flow diagram of the input parameter selection step shown generally in FIG. 4.

FIG. 5 is a detailed flow diagram of the procedure used to collect the processor inputs shown as step 102 in FIG. 4. The processor checks the receiver data interface at 100 and determines whether or not data is present on the interface at 130. If the data is present following a burst, the processor reads the RSSI, Fvar, and Tvar inputs at 138. Since the transmitted signal contains a cylindrical redundancy checksum (CRC) field as shown in FIG. 1, the processor can then execute a conventional CRC to determine whether the data is valid at 140. If it is not, then a frame indicator (FI) is set to "POOR" at 142. If the CRC shows that the data is valid at 140, then the FI is set to "GOOD" at 144.

If no data is received by the processor at the end of a burst as determined at 130, the processor reads the RSSI input at 132. The Fvar and Tvar inputs generally are not generated when data is not available, so these inputs are set to constants K1 and K2, respectively at 134. Furthermore, if no data was received, the entire frame or burst is considered to be a MISS or a FAILURE. Therefore, the FI is set to MISS at 136. Thus the inputs provided to step 104 include the RSSI, Fvar, Tvar. and a FI.

The present invention preferably utilizes a signal quality estimator to determine whether the received signal quality is good or poor. The signal quality estimator according to the present invention accepts an input of the following parameters:

F'var{n} the estimated frequency variance for the current frame;

T'var{n} the estimated timing variance for the current frame;

SA{n} the estimated average signal strength for the current frame; and

F{n} the estimated frame error rate for the current frame; where n corresponds to a frame in time, i.e. digital time.

The estimated frequency variance, estimated time variance, and average signal strength are derived from filtering the input parameters Fvar, Tvar, and RSSI, respectively. In a preferred embodiment, a simple first order IIR filter is used as follows:

F'var{n}=a*Fvar+(1−a)*F'var{n−1}

T'var{n}=a*Tvar+(1−a)*T'var{n−1}

SA{n}=a*RSSI+(1−a)*SA{n−1}.

where a is the filter gain. It should be understood that a may be any number between zero and one (0<a<1) but that the selection of a determines the filter's reaction time, i.e., the time it takes to reach the steady state, and the filter's stability in the steady state, i.e., how much the response oscillates about the steady state value. In a preferred embodiment, a=1/16 has been selected to provide a relatively fast filter.

The estimated frame error rate F{n} is also derived by filtering the input parameter, however this input parameter, the frame indicator (FI), is a discrete value. As such, FI in a preferred embodiment, is set to zero if data is received and has a GOOD CRC as shown in FIG. 5 at 144. In that case:

$$F\{n\}=(1-a)*F\{n-1\}.$$

However, if the frame indicator was set to a "MISS" at 136 or "POOR" at 142 in FIG. 5, FI is equal to one and an impulse X is added to the IIR filter equation, such that:

$$F\{n\}=a*FI*X+(1-a)*F\{n-1\}.$$

It should be understood that appropriate values of X and FI are determined experimentally.

In a more preferred embodiment, it is desirable to limit the maximum value of F{n} so that in the event that numerous frames in a row are missed or are determined to be poor, it will not take too long to recover when the data is again received. Therefore, F{n} is preferably compared to a predetermined maximum frame error rate M, after each burst. If F{n} is greater than M, F{n} is set equal to M. By limiting the maximum value of F{n} in this way, the signal quality indicator can quickly change from poor to good when the signal reception does in fact change from poor to good as will be evident from the discussion of the signal quality estimation procedure below.

The use of a simple IIR filter to generate the estimates is advantageous in two respects. It reduces the memory requirements in that only the most previous estimate must be saved. It also generates these estimates quickly in a manner simple to implement in a control processor. In particular, where a is selected as an inverse power of 2, bit shifting can be used instead of multiplication. The computations are thus possible using 8-bit arithmetic with no carries or fractions, providing great savings in cost without any significant degradation in performance.

Figure 6:
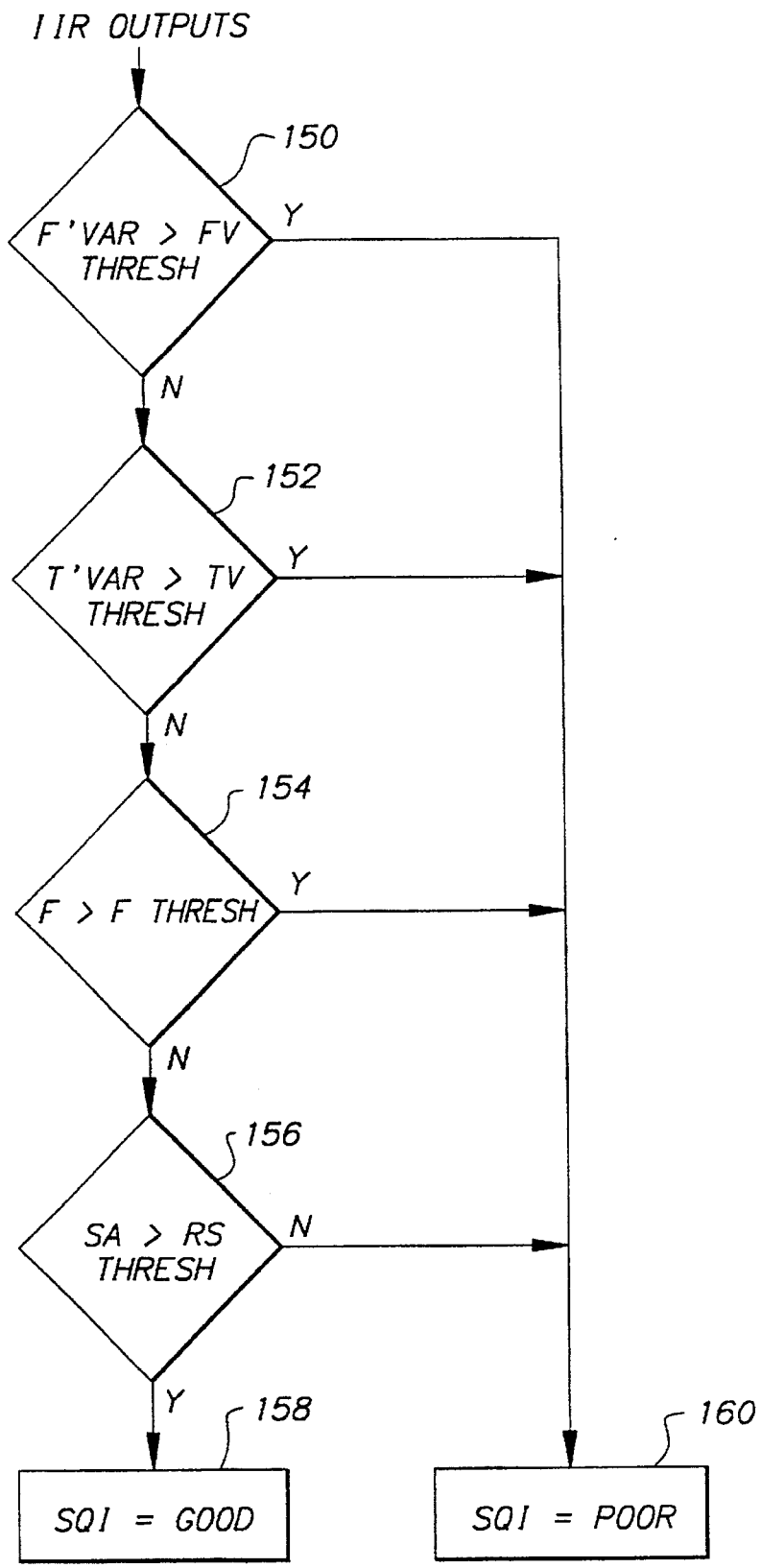
FIG. 6 is a detailed flow diagram of the signal quality update step shown generally in FIG. 4.

A detailed flow diagram of the Signal Quality Estimation Procedure is shown in FIG. 6. Each of the estimates are compared to a predetermined threshold. If any of the estimates except for the RSSI are greater than its corresponding threshold, then the signal quality indicator (SQI) is set to "POOR" at 160. If each of the estimates is less than or equal to its corresponding threshold, with the exception of the RSSI, then the SQI is set to "GOOD" at 158.

Specifically, the estimated frequency variance is compared to a frequency variance threshold (FVThresh) at 150, the estimated timing variance is compared to a timing variance threshold (TVThresh) at 152, the estimated frame error rate is compared to a Frame error rate threshold (FThresh) at 154, and the estimated average signal strength is compared to an average received signal strength threshold (RSThresh) at 156. Each of the thresholds are derived based on a desired bit error rate for the channel. The threshold values are chosen so that with the expected noise and interference each test will fail and the signal quality will be judged "POOR" when the data bit error rate is high enough to cause noticeable degradation in system performance. These thresholds are best determined by experimentation with the actual system. In the preferred embodiment the thresholds are set so the tests fail and system quality is judged "POOR" when the bit error rate is worse than one part in 100,000.

Figure 7:
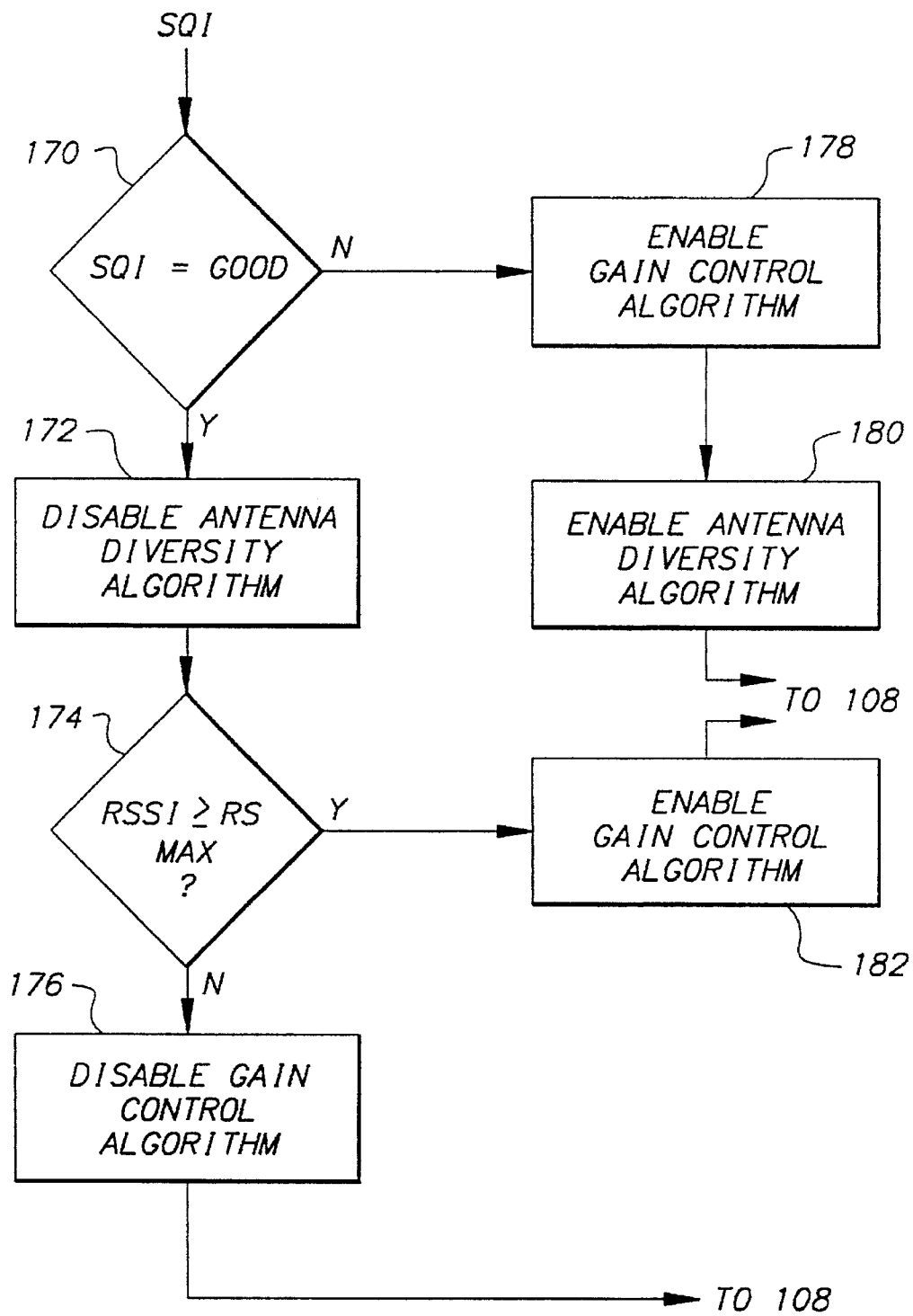
FIG. 7 is a detailed flow diagram of the control function step shown generally in FIG. 4.

FIG. 7 is a detailed flow diagram of the control program. The control program receives the SQI as an input. If the SQI is "GOOD" as determined at 170, the antenna diversity procedure is disabled at 172. Then the RSSI is checked to determine whether the received signal is strong at 174. This may be implemented by comparing the RSSI to a predetermined maximum signal strength (RSmax). If the RSSI is less than RSmax, then gain control procedure is disabled at 176. If the RSSI is greater than or equal to RSmax, then the gain control procedure is enabled at 182. If the SQI is "POOR" as determined at 170, both the antenna diversity procedure and the gain control procedure are enabled at 178 and 180, respectively.

Figure 8:
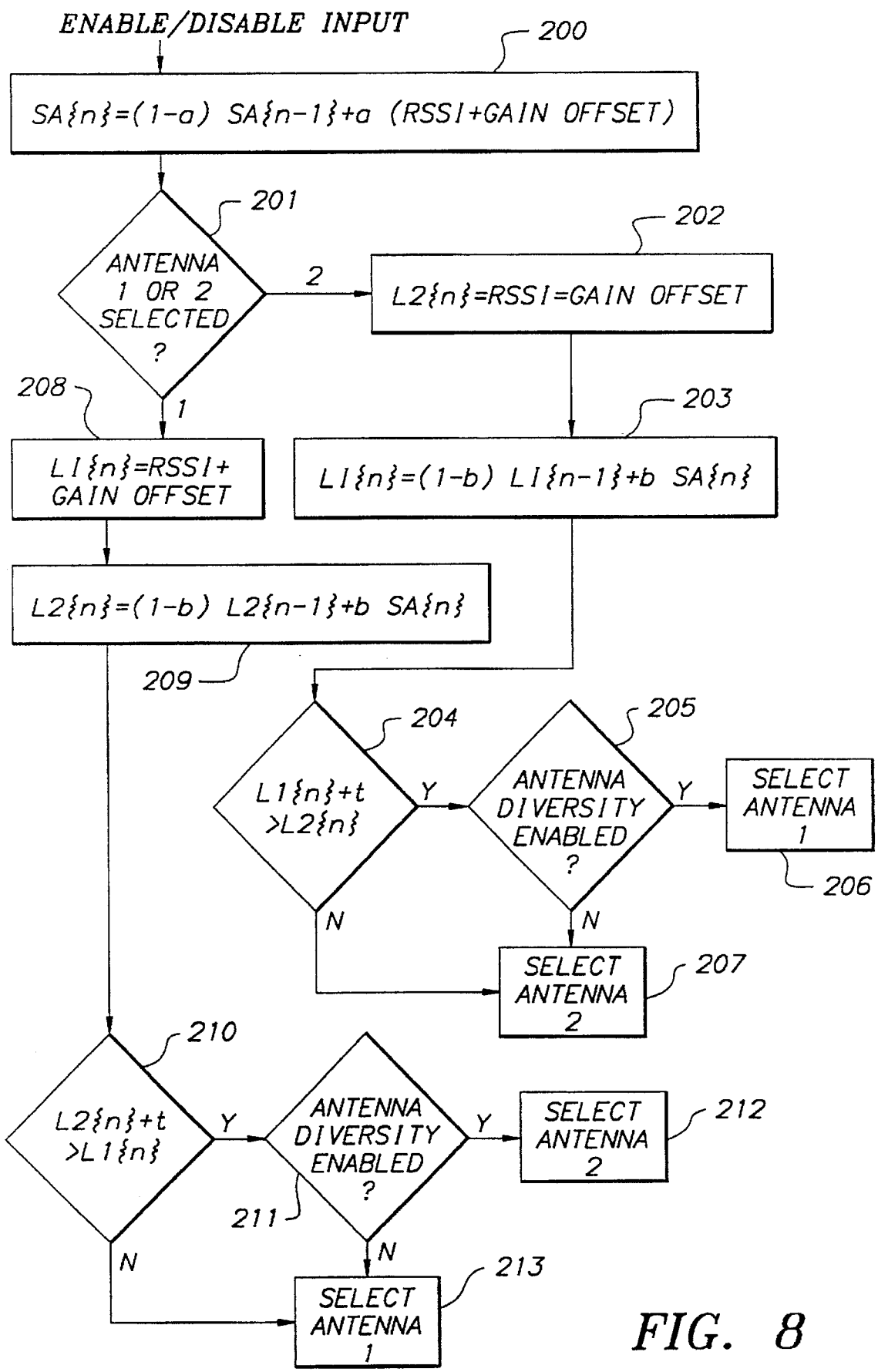
FIG. 8 is a detailed flow diagram of the antenna diversity procedure according to a preferred embodiment of the present invention.

Next the antenna diversity procedure is executed regardless of whether the control program enabled or disabled the procedure. However, if the procedure is disabled the antenna selection will not change. A detailed flow diagram of the antenna diversity procedure is shown in FIG. 8. The estimated average signal strength is generated at 200. This may be the average signal strength SA{n} generated during the step of updating the IIR filters 104 shown in FIG. 4 and described above. Alternatively, the estimated average signal strength may be regenerated using a slower IIR filter so that unnecessary switching can be avoided.

If the first antenna is currently selected as determined at 201, the estimated received signal level into the first antenna (L1{n}) is set equal to the RSSI at 208. The estimated received signal level into the second antenna L2{n} is derived from a previous estimate L2{n−1} and a long term estimate SA{n} as shown by the equation at 209. Thus even when the antenna is in an OFF state the received signal level can be estimated.

If the estimated received signal level into the second antenna plus a predetermined antenna selection threshold (t) is greater than the estimated received signal level into the first antenna as determined at 210, then the procedure checks whether antenna diversity has been enabled at 211. If antenna diversity has been disabled or if the estimated received signal level into the first antenna is greater than the estimated level into the second antenna plus the threshold (t), then the antenna selection remains unchanged and the procedure provides an output indicating selection of the first antenna at 213. Otherwise, the procedure provides an output indicating selection of the second antenna at 212 causing a switch over from the first antenna to the second antenna.

Similarly, if the second antenna is selected as determined at 201, the estimated received signal level into the second antenna (L2{n}) is set equal to the RSSI plus the selected gain at 202. The estimated received signal level into the first antenna L1{ } is derived from a previous estimate L1{n−1} and a long term estimate SA{n} as shown by the equation at 203.

If the estimated received signal level into the first antenna plus the predetermined antenna selection threshold (t) is greater than the estimated received signal level into the second antenna as determined at 204, then the procedure checks whether antenna diversity has been enabled at 205. If antenna diversity has been disabled or if the estimated received signal level into the second antenna is greater than the estimated level into the first antenna plus the threshold (t), then the antenna selection remains unchanged and the procedure provides an output indicating selection of the second antenna at 207. Otherwise, the procedure provides an output indicating selection of the first antenna at 206 causing a switch over from the second antenna to the first antenna.

Figure 9:
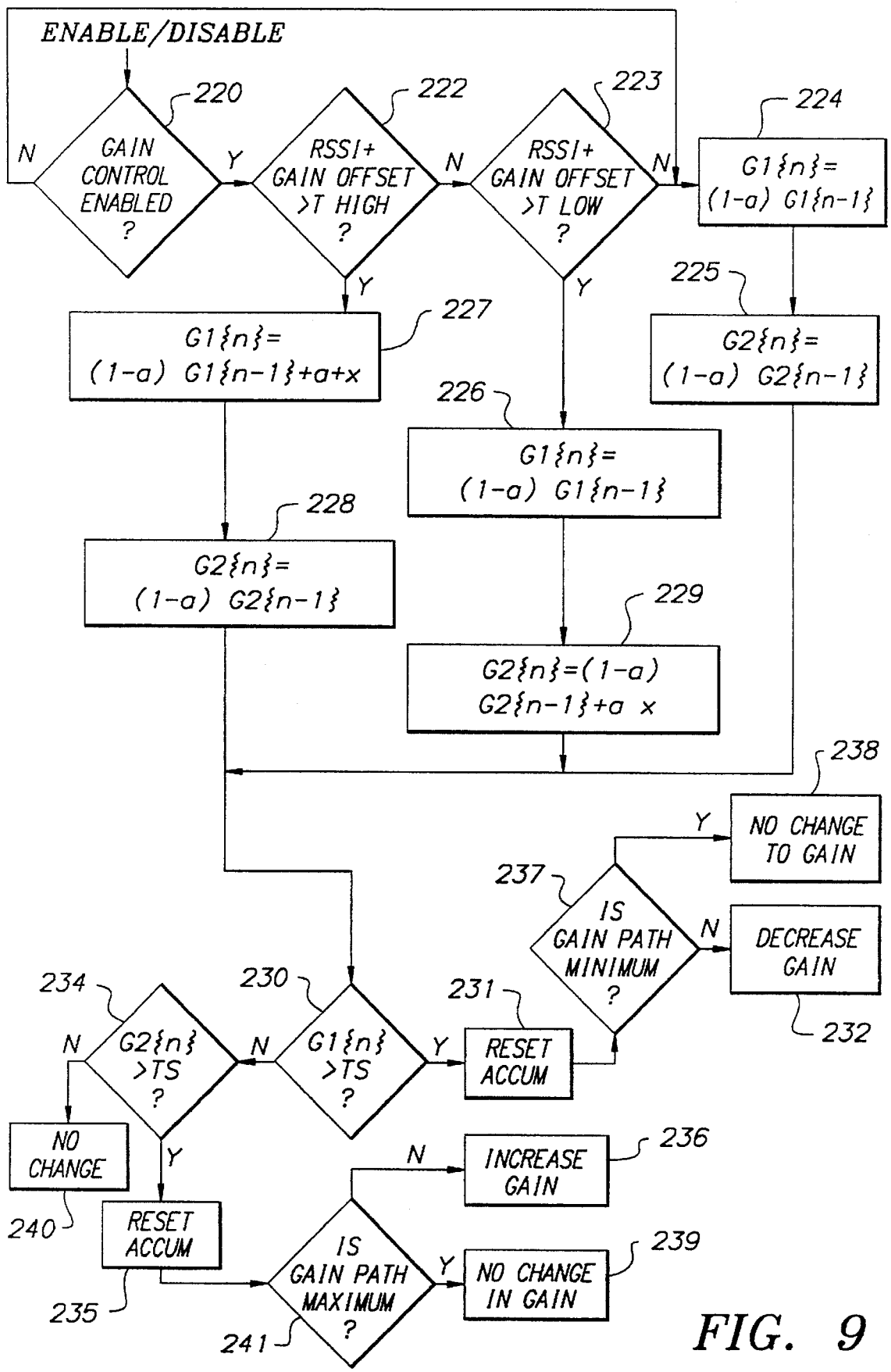
FIG. 9 is a detailed flow diagram of the gain control procedure according to a preferred embodiment of the present invention.

The gain control procedure is provided to keep the gain high enough to minimize the BER and low enough to prevent saturation and degradation due to intermodulation. A detailed flowchart of the gain control procedures is shown in FIG. 9. As described above with reference to FIG. 3, the handset provides three discrete gain paths 15, 19, and 17. The selection of one of a relatively small number of possible gain or attenuation values is preferable in a system in which the receiver limits and samples the received signal prior to demodulation, as described in co-pending application Ser. No. 07/999,210 now U.S. Pat. No. 5,376,894, in contrast to other receivers using an A/D converter to digitize the receive signal. It should be understood that when using an A/D converter, the received signal resolution must be very good, whereas the resolution is much less critical when digitizing the received signal using a limiter and sampler combination the primary requirement being that the received signal level is within a general range.

If the gain control procedure is enabled as determined at 220, the procedure compares the RSSI plus the selected gain with a predetermined high level threshold (TH) at 222. If the RSSI plus the selected gain is greater than TH, then the value of a first gain accumulator G1{n} is calculated according to the equation shown at step 227, where a is the IIR filter gain and X is an added impulse. Then a second gain accumulator G2{n} is updated according to the equation shown at 228. If G1{n} is greater than a gain switching threshold (TS), the accumulators G1{n} and G2{n} are reset at 231. If the currently selected gain path as determined at 237 is not the minimum, e.g. gain path 17 shown in FIG. 3, then the next lowest gain path is selected at 232. For instance, if the currently selected gain path is gain path 15 having an 18 dB gain, then the next lowest gain path is gain path 19 having no gain at all. However, if the gain path is already the minimum gain path as determined at step 237, no change is made to the current gain control indicator as shown at 238.

If the first gain accumulator is not greater than the gain switching threshold at 230, then the procedure determines whether the second gain accumulator is greater than the gain switching threshold at 234. If it is greater, the gain accumulators are reset at 235. If the currently selected gain path as determined at 241 is not the maximum gain path, then the gain path is increased at 239, i.e. gain path 17 which attenuates the received signal by 20 dB is changed to gain path 19 which does not attenuate the received signal.

As discussed above, it is desirable to simply keep the level of the signal between a maximum and minimum range, between a high threshold (TH) and a low threshold (TL). Thus when the RSSI plus the selected gain is greater than TH as determined at 222, the value of G1{n} is increased by adding the impulse X as shown at 227, whereas the value of G2{n} is permitted to decay in accordance with the IIR filtering. However if the RSSI plus the selected gain is less than TL, it is desirable to allow the value of G1{n} to decay in accordance with the IIR filter response as shown by the equation at 226 and the value of G2{n} is increased by the addition of impulse X as shown at 229. Accordingly, if TL<RSSI+ selected gain<TH, no switching is necessary so both gain accumulators are permitted to decay with the IIR filter response as shown by the equations in steps 224 and 225. Allowing the gain accumulators to decay ensures that neither one will exceed the gain switching threshold and therefore, the gain path will not be unnecessarily switched.

When the gain control procedure is disabled as determined at step 220, both gain accumulators are permitted to decay as shown at 224 and 225. Therefore, no switching will be effected as shown at 240 when the gain control procedure is disabled since TS is greater than the decay values.

The following describes the operating parameters of the present invention according to a preferred embodiment. However, it should be understood that the following description is to be used for explanatory purposes only and is not meant to limit the invention as described hereinabove.

As a practical matter, the IIR estimation filters are initialized to constants. The accumulators are set to zero during an initialization process. The initial indicators are preferably set so that the SQI will be set to "POOR".

Referring back to FIG. 3, the procedures are preferably implemented in a custom processor in the BBIC 24. The procedures are appropriate for many commercially available microprocessors and microcontrollers, such as the Intel 8051, the Motorola 6800, the Hitachi H8, and many others. In particular the procedures were designed to minimize RAM and ROM usage, since the processor 25, RAM (not shown), and ROM (not shown) are all preferably included in the BBIC 24 digital ASIC which limits available memory resources.

The receive signal strength is preferably computed from a 5-bit (value of 0 to 31) receive signal strength indicator (RSSI) read in the IFIC 22 and computed by the level measurement device 21. The indicator limits at a value of 0 and saturates at a value of 31. In this preferred embodiment, there are three possible receive gain levels, as controlled by the gain control procedure described above.

The signal strength is estimated from the following parameters and equation:

n: digital "time" measured in bursts

G{n}: gain of receiver at frame n; G{n} will be high, middle, or low f(): signal strength offset function RSSI{n}: receive signal strength indicator at frame n a: RSSI indicator slope SS {n}: signal strength indicator at slope n SS{n}=a*RSSI{n}+f(G{n})

In this preferred embodiment a is about 1.25 dB/(RSSI step) and f(high gain) is about −109 dBm, f(middle gain) is about −93 dBm, and f(low gain) is about −69 dBm. Although these values are preferred in a DCT system operating as described above, the antenna diversity procedure and gain control procedure are operational with most signal strength indicators.

For the antenna diversity algorithm described in conjunction with FIG. 8, a, the signal strength filter constant, is preferably set to 1/64 and is implemented as a shift right 6 times, b, the diversity IIR filter gain, is preferably set to 1/16 and is implemented as a shift right 4 times, and t, the antenna switching threshold, is about 1.25 dB (or equivalent to one RSSI step in this preferred embodiment).

In addition to the current signal level information described above, the parameters used in this gain control procedure are:

THigh, the high level threshold, which is a function of the selected gain level:
high gain: = −80 dBm
medium gain: = −60 dBm
low gain: =0 dBm TLow, the low level threshold, which is a function of the current gain level:
high gain: −106 dBm
medium gain: −82 dBm
low gain: −62 dBm Ts, the switching threshold, is set to 64.

a, the IIR filter gain, is 1/16 or a right shift four times; and

X, the input impulse, equals 32.

Like the antenna diversity procedure, the gain control procedure would be operational for many other parameter values. As would be understood by those skilled in the art these parameter would be adjusted depending upon the communications system and its operation.

The procedure for estimating the frame error rate as described herein preferably uses the following parameters:

a, the frame error rate gain, is 1/16 or a shift right four times

M, the maximum value for frame error rate filter, equals 63 x, the impulse value, is 64

The receive signal level threshold is a function of receive gain level. Preferably the receive signal strength threshold (RSTHRESH) is 10. The other thresholds shown in FIG. 6 are as follows:

FVThresh: The frequency variance threshold corresponds to an error rate of 0.00001.

TVThresh: The timing variance threshold corresponds to an error rate of 0.00001.

FThresh: The frame error rate threshold equals 31.

While the invention has been described and illustrated with reference to specific embodiments, those skilled in the art will recognize that modification and variations may be made without departing from the principles of the invention as described hereinabove and set forth in the following claims.

We claim:

1. A method of selecting one of two antennas to optimize a bit error rate in a communications system using spacial diversity, said communications system transmitting data in bursts, comprising the steps of:

receiving a transmitted signal at said two antennas and defining the same as respective first and second received signals;

selecting, for each successive burst, one of said first and second received signals, defining the same as a selected received signal, and defining the one of said first and second received signals not selected as the non-selected received signal;

generating, for each successive burst, a received signal strength indicator (RSSI) based on the power level of said selected received signal;

estimating, for each successive burst, an average signal strength based on said RSSI and the average signal strength estimated in connection with a most previous burst;

generating a selected signal level associated with said selected received signal based on said RSSI;

generating an estimated signal level associated with said non-selected received signal based on said estimated average signal strength and a current estimated signal level estimated in connection with the most previous burst;

comparing said selected signal level with said current estimated signal level and based on said comparison further generating an antenna diversity indicator indicative of a desired selection of one of said two antennas during a next successive burst; and selecting one of said first and second received signals during the next successive burst in response to said antenna diversity indicator.

2. The method of claim 1, wherein the step of estimating said average signal strength is carried out using an infinite impulse response digital filter.

3. The method of claim 1, wherein the step of generating said estimated signal level associated with said non-selected received signal is carried out using an infinite impulse response digital filter.

4. The method of claim 1, further comprising the step of disabling the steps of selecting one of said first and second received signals by repeating the same antenna diversity indicator during the next successive burst regardless of said comparison.

5. The method of claim 4, wherein a single receiver chain is operative to generate the following parameters based on the selected received signal:

a frequency variance indicative of a phase offset of the selected received signal, a timing variance indicative of symbol jitter in the selected received signal, and a frame error rate indicative of a number of bursts which are not detected by said receiver chain; and wherein the method further comprises:

averaging each said parameter to generate an estimate of each said parameter for a period of time corresponding to the next burst of transmitted data;

generating a signal quality indicator based upon each of the estimated parameters; and said selecting steps being disabled and enabled based on said signal quality indicator.

6. The method of claim 5, wherein each burst of transmitted data includes CRC information, the method further comprising the steps of:

determining whether data was received by said receiver chain during the most previous burst; and defining a frame indicator, if data was so received, based on said CRC information, wherein said frame error rate is based on said frame indicator.

7. The method of claim 5, wherein said signal quality indicator is acceptable if each of the following is true:

said estimated frequency variance is greater than a predetermined frequency variance threshold, said estimated timing variance is greater than a predetermined timing variance threshold, said estimated frame error rate is greater than a predetermined frame error rate threshold, and said estimated received signal strength is less than a predetermined signal strength threshold; and said selecting steps being disabled only if said signal quality indicator is acceptable.

8. The method of claim 5, wherein the step of averaging said parameters is carried out using an infinite impulse response digital filter.

9. The method of claim 1, wherein said communications system comprises only a single receiver.

10. The method of claim 1, further comprising the steps of:

updating a high gain accumulator during each burst;

updating a low gain accumulator during each burst; and adjusting the gain level of the selected received signal if said high gain accumulator is greater than a predetermined high threshold and if said low gain accumulator is greater than a predetermined low threshold.

11. A method of using antenna diversity in a communications system having at least two antennas for receiving a transmitted signal and only one receiver chain for down-converting and demodulating received signals, signals being transmitted in successive bursts, comprising the steps of:

selecting a received signal associated with one of said antennas and defining the same as a selected received signal;

determining the signal strength of said selected received signal and defining the same as a selected signal strength;

estimating signal strengths of received signals associated with said antennas not associated with said elected received signal and defining them as estimated signal strengths; and comparing said selected signal strength with said estimated signal strengths to determine whether a different one of said received signals should be selected during a next successive burst, whereby said selecting step during the next successive burst is carried out in response to said comparison.

12. The method of claim 11, further comprising the steps of:

generating a number of parameters relating to the quality of the selected received signal;

generating an average for each of said parameters; and determining whether the quality of the selected received signal is acceptable based upon said averaged parameters;

said selecting step being based upon said determination of the quality of said selected received signal.

13. The method of claim 12, wherein the step of generating said average parameters is carried out using an infinite impulse response digital filter.

14. The method of claim 11, wherein the step of estimating the signal strengths of said received signals is carded out using an infinite impulse response digital filter.

15. The method of claim 11, wherein one of a plurality of gain levels is applied to said selected received signal, the method further comprising the steps of:

updating a high gain accumulator during each burst;

updating a low gain accumulator during each burst; and selecting a different one of said plurality of gain levels to be applied to the selected received signal during the next successive burst if said high gain accumulator is greater than a predetermined high threshold and if said low gain accumulator is greater than a predetermined low threshold.

16. A communications system comprising:

at least two antennas separated in space for receiving a transmitted signal, each antenna of the at least two antennas generating a signal from the received transmitted signal;

an antenna switching means for selecting one signal generated by one of said at least two antennas and defining the same as a selected received signal;

receiving means interfaced with said antenna switching means to receive the selected received signal for downconverting and demodulating the selected received signal and for generating an output indicative of the signal strength of said selected received signal and defining said output as a received signal strength indicator (RSSI); and a processing means interfaced with said receiving means to receive the RSSI for determining therefrom the signal strength of said selected received signal and defining the same as a selected signal strength, for generating an average signal strength and for estimating the signal strengths of the signals generated by each of the non-selected antennas based on said average signal strength;

said processing means also interfaced with said antenna switching means and being further operative to compare said selected signal strength to said estimated signal strengths and to generate a diversity control signal based on said comparison, said switching means being responsive to said diversity control signal.

17. The communications system of claim 16, wherein said receiving means is also operative to generate a plurality of parameters related to the quality of said selected received signal and wherein said processing means is operative to receive said plurality of parameters, defining the same as estimated parameters and adjusting said diversity control signal based on said estimated parameters and said average signal strength.

18. The communications system of claim 17, wherein said processing means comprises infinite impulse response filters for generating said estimated parameters and said average signal strength.

19. The communications system of claim 16, wherein said processing means comprises an infinite impulse response filter for generating said average signal strength.

20. The communications system of claim 16, further comprising:

a gain switching means providing a number of gain level paths and being interfaced between said antenna switching means and said receiving means for receiving said selected received signal and for adjusting the gain of said selected received signal by coupling the output of said antenna switching means to a selected one of said gain level paths: and said processing means generating a gain control signal indicative of the gain level path to be selected and said gain switching means being responsive to said gain control signal.

* * * * *